US010254782B2

(12) United States Patent
He

(10) Patent No.: US 10,254,782 B2
(45) Date of Patent: Apr. 9, 2019

(54) APPARATUSES FOR REDUCING CLOCK PATH POWER CONSUMPTION IN LOW POWER DYNAMIC RANDOM ACCESS MEMORY

(71) Applicant: MICRON TECHNOLOGY, INC., Boise, ID (US)

(72) Inventor: Yuan He, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 15/251,850

(22) Filed: Aug. 30, 2016

(65) Prior Publication Data

US 2018/0059764 A1 Mar. 1, 2018

(51) Int. Cl.
*G06F 1/06* (2006.01)
*G06F 1/3234* (2019.01)
*G11C 7/22* (2006.01)
*G11C 11/4076* (2006.01)

(52) U.S. Cl.
CPC .............. *G06F 1/06* (2013.01); *G06F 1/3275* (2013.01); *G11C 7/222* (2013.01); *G11C 11/4076* (2013.01)

(58) Field of Classification Search
CPC ... G06F 1/324; G06F 1/08; G06F 1/06; G06F 1/3275; G11C 7/222; G11C 11/4076
USPC ........ 327/158, 254, 156; 713/310, 323, 500; 711/104, 5, 240; 365/222, 193, 194; 375/355
See application file for complete search history.

(56) References Cited

U.S. PATENT DOCUMENTS

| | | | | |
|---|---|---|---|---|
| 6,044,429 A | * | 3/2000 | Ryan | G06F 13/161 710/240 |
| 6,557,090 B2 | * | 4/2003 | Ho | G11C 7/1018 711/104 |
| 2005/0134337 A1 | * | 6/2005 | Lee | G06F 1/10 327/158 |
| 2006/0238227 A1 | * | 10/2006 | Kim | H03L 7/0814 327/158 |
| 2007/0028027 A1 | * | 2/2007 | Janzen | G06F 13/1684 711/5 |
| 2007/0047683 A1 | * | 3/2007 | Okamura | H03L 7/0814 375/355 |
| 2008/0126059 A1 | * | 5/2008 | Harrison | G11C 7/1078 703/13 |

(Continued)

*Primary Examiner* — Aurel Prifti
(74) *Attorney, Agent, or Firm* — Dorsey & Whitney LLP

(57) ABSTRACT

Apparatus and methods of reducing clock path power consumption are described herein. According to one embodiment, an example apparatus includes a clock control circuit. The clock control circuit includes a command/address domain configured to selectively provide a command/address clock signal based, at least in part, on a chip select signal. The clock control circuit further includes a command domain circuit configured to selectively provide a command clock signal based, at least in part, on the chip select signal. The clock control circuit further includes a column latency domain circuit configured to selectively provide a column latency clock signal based, at least in part, on a memory command. The clock control circuit further includes a four phase domain circuit configured to selectively provide a four phase clock signal based, at least in part on the memory command.

20 Claims, 13 Drawing Sheets

(56) References Cited

U.S. PATENT DOCUMENTS

| | | | |
|---|---|---|---|
| 2009/0019323 A1* | 1/2009 | Porterfield | G06F 13/4243 714/700 |
| 2010/0177583 A1* | 7/2010 | Koshizuka | G11C 5/04 365/222 |
| 2012/0120745 A1* | 5/2012 | Miyano | G11C 11/4076 365/193 |
| 2013/0028034 A1* | 1/2013 | Fujisawa | G11C 11/40615 365/194 |
| 2013/0120036 A1* | 5/2013 | Zhu | H03L 7/0805 327/156 |
| 2013/0339775 A1* | 12/2013 | Shaeffer | G11C 7/1072 713/323 |
| 2015/0033044 A1* | 1/2015 | Tsern | G11C 11/4074 713/310 |
| 2015/0162073 A1* | 6/2015 | Kim | G11C 11/40615 365/189.02 |
| 2015/0171849 A1* | 6/2015 | Vo | H03K 5/1515 327/254 |
| 2015/0198968 A1* | 7/2015 | Ko | G06F 1/08 713/500 |
| 2017/0110169 A1* | 4/2017 | Kim | G06F 13/1689 |
| 2017/0125077 A1* | 5/2017 | Choi | G11C 7/222 |

* cited by examiner

APPARATUSES FOR REDUCING CLOCK PATH POWER CONSUMPTION IN LOW POWER DYNAMIC RANDOM ACCESS MEMORY

BACKGROUND

As clock speeds in low power dynamic random access memory (LPDRAM) devices increases, duty cycle distortion becomes common on the falling edge of the clock signals. In double data rate (DDR) devices, which provide output data on both the rising edge and the falling edge of the clock signal, the duty cycle distortion can negatively affect performance. However, correcting the duty cycle distortion often involves complex clock generators that result in significant power consumption. Accordingly, there is a need for a circuit can provide the requisite clock signals while reducing or minimizing clock path power consumption without sacrificing performance.

DETAILED DESCRIPTION

Certain details are set forth below to provide a sufficient understanding of embodiments of the invention. However, it will be clear to one skilled in the art that embodiments of the invention may be practiced without these particular details.

Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention recognize that there is a need fora holistic solution to save power when generating necessary dock signals of LPDRAM devices without sacrificing the performance in the clock signals. Traditional techniques for reducing clock power consumption in LPDRAM devices involve clock gating. However, traditional techniques suffer from various drawbacks, such as the potential for metastable states, in which data does not arrive at a latch sufficiently ahead of a clock trigger to guarantee a valid output. Further, as clock speeds increase, duty cycle skew, particularly on the falling edge of the external clock signal, may negatively affect performance. For example, command decoding, column latency compliance, and data output may all be negatively affected by duty cycle skew. Disclosed herein are various apparatuses and methods for reducing clock path power consumption in an LPDRAM device.

Figure 1:
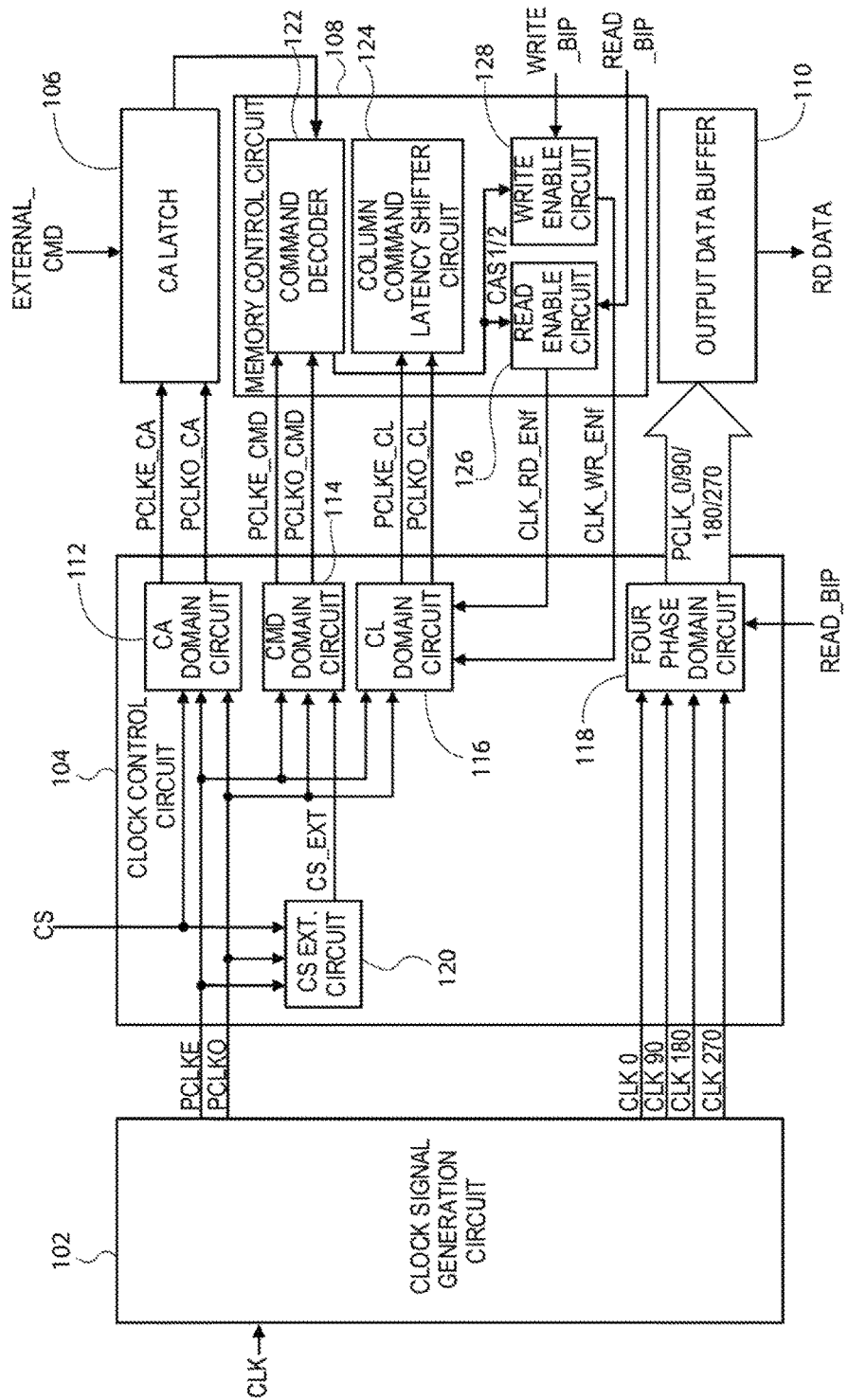
FIG. 1 is block diagram of a clock path of an LPDRAM device, in accordance with an embodiment of the present invention.

FIG. 1 is block diagram of a clock path of an LPDRAM device, in accordance with an embodiment of the present invention. The device of FIG. 1 generally includes a clock signal generation circuit 102, a clock control circuit 104, a command/address (CA) latch 106, a memory control circuit 108 and an output data buffer 110.

Figure 2:
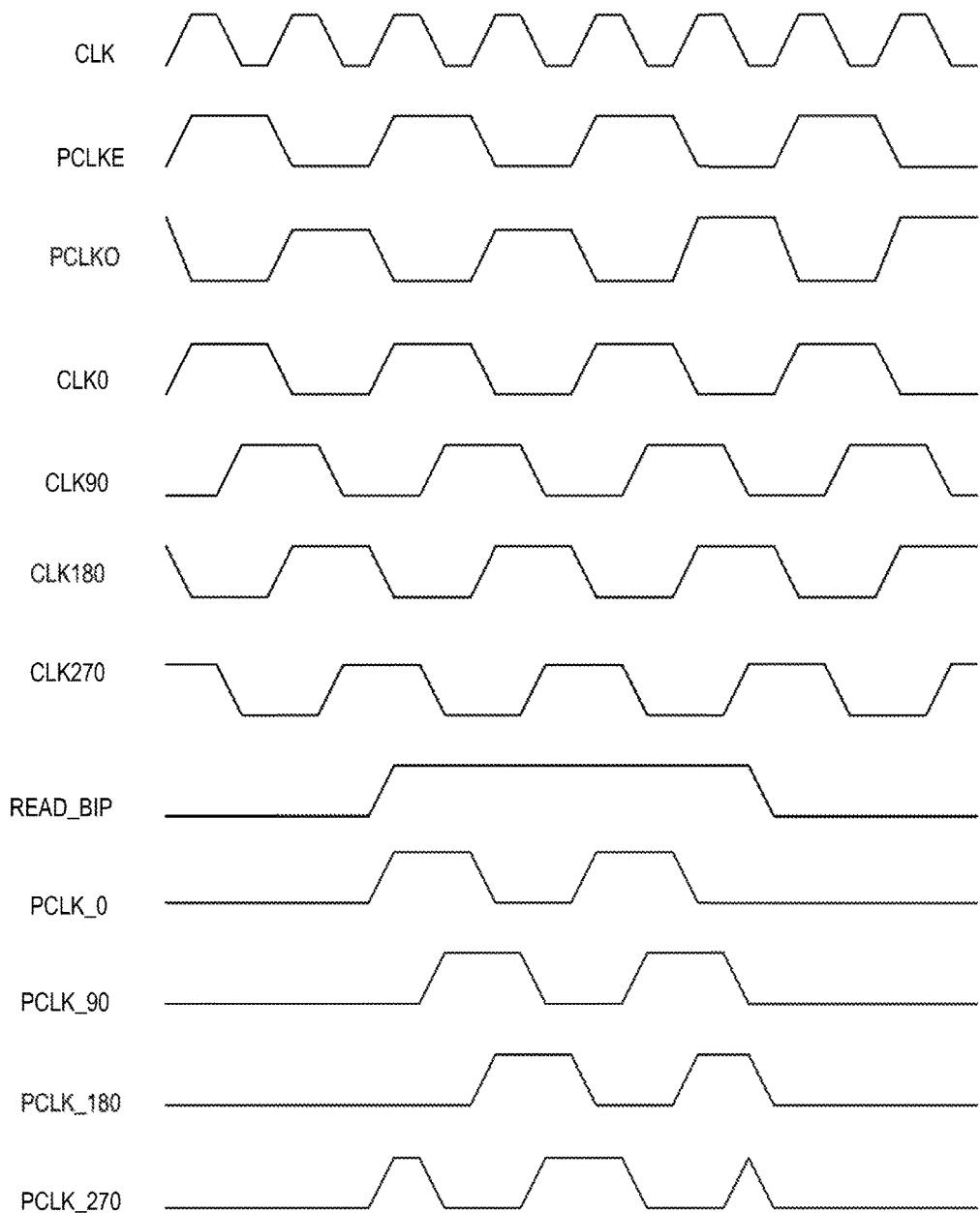
FIG. 2 is a timing diagram of the input and output clock signals of the clock generation circuit of FIG. 1, in accordance with an embodiment of the present invention.

The clock signal generation circuit 102 may be any circuit configured to receive an external clock signal CLK and to provide even and odd clock signals PCLKE, PCLKO and a four phase clock signal CLK0, CLK90, CLK180, CLK 270. A timing diagram of the external clock CLK, the even and odd clocks PCLKE, PCLKO, and the four phase clock signals CLK0, CLK90, CLK180, CLK 270 is shown in FIG. 2. In various embodiments, the even and odd clock signals PCLKE, PCLKO are 180 degrees out of phase with each other. The even and odd clock signals PCLKE and PCLKO may have a period that is twice the period of the external clock CLK. Various circuits described herein include corresponding circuits for the even and odd clock signals PCLKE, PCLKO. For example, a first circuit may receive the even clock signal PCLKE and produce an even output clock signal. A second circuit may be identical in all aspects to the first circuit except that the second circuit receives the odd clock signal PCLKO and produces an odd output signal that is 180 degrees out of phase with the even output signal produced by the first circuit. For simplicity, such circuits may be generically described with reference to a generic clock signal PCLK with the understanding that a similar circuit can be implemented for each of the even clock signal PCLKE and the odd clock signal PCLKO.

The four phase clock signals CLK0, CLK90, CLK180, CLK 270 may include four clock signals having periods equal to those of the even and odd clock signals PCLKE, PCLKO. A first clock signal of the four phase clock signals CLK0, CLK90, CLK180, CLK 270 may have a phase that is offset by 90 degrees from a phase of a second clock signal of the four phase clock signals CLK0, CLK90, CLK180, CLK 270. For example, the first of the four phase clock signals, CLK0, may have a phase that is aligned with the phase of the even clock signal PCLKE. The second of the four phase clock signals, CLK90, may be 90 degrees out of phase with the even clock signal PCLKE. The third of the four phase clock signals, CLK180, may 180 degrees out of phase with the even clock signal PCLKE and in phase with the odd clock signal PCLKO. The fourth of the four phase clock signals CLK270 may be 270 degrees out of phase with the even clock signal. Although the first of the four phase clock signals CLK0 may be in phase with the even clock signal PCLKE, the two clocks may have different properties, such as different voltage levels. Similarly, the third of the four phase clock signals CLK180 may be in phase with the odd clock signal PCLK0, but the two clock signals may have different properties as well.

The clock control circuit 104 is generally configured to control the provision of clock signals to various circuits, domains, blocks, etc. in the LPDRAM device. The circuitry of the clock control circuit 104 may be divided into a plurality of domain circuits consisting of sub-circuits of the clock control circuit 104 that are configured to control provision of clock signals to various other circuits in the LPDRAM device. In the embodiment of FIG. 1, the clock control circuit 104 includes four such domain circuits: a CA domain circuit 112, a command domain circuit 114, a column latency domain circuit 116 and a four phase domain circuit 118. The clock control circuit 104 may further include a chip select extension circuit 120. The clock control circuit 104 may be configured to receive a chip select signal CS from the chip select internal buffer (not shown) of the LPDRAM device and a read burst-in-progress signal READ_BIP signal, which may be generated by the LPDRAM device in response to a read command to indicate when a read burst is in progress.

The CA domain circuit 112 is a sub-circuit of the clock control circuit 104 that is configured to receive the chip select signal CS and the even and odd clock signals PCLKE, PCLKO. The CA domain circuit 112 is further configured to selectively provide even and odd CA clock signals PCLKE_CA, PCLKO_CA based on the chip select signal CS and the even and odd clock signals PCLKE, PCLKO. In various embodiments, the even CA clock signal PCLKE_CA may be based on the even clock signal PCLKE, and the odd CA clock signal PCLKO_CA may be based on the odd clock signal PCLKO. The CA clock signals PCLKE_CA, PCLKO_CA may be provided to the CA latch 106 in order to latch an external command EXTERNAL_ CMD to the LPDRAM device. The CA latch 106 may provide the external command EXTERNAL_CMD to the command decoder 122 for processing. An example circuit of a CA domain circuit 112 is discussed in further detail below with respect to FIG. 3.

The command domain circuit 114 is a sub-circuit of the clock control circuit 104 that is configured to receive an extended chip select signal CS_EXT and the even and odd clock signals PCLKE, PCLKO. The command domain circuit 114 is further configured to selectively provide even and odd command clock signals PCLKE_CMD, PCLKO_CMD based on the extended chip select signal CS_EXT and the even and odd clock signals PCLKE, PCLKO. In various embodiments, the even command clock signal PCLKE_ CMD may be based on the even clock signal PCLKE, and the odd command clock signal PCLKO_CMD may be based on the odd clock signal PCLKO. The even and odd command clock signals PCLKE_CMD, PCLKO_CMD may be provided to a command decoder 122 in the memory control circuit 108. The command decoder 122 may be configured to generate internal commands (e.g., CAS1 and CAS2) based on the external command ETERNAL_CM received at the command latch 106 and the even and odd command clock signals PCLKE_CMD, PCLKO_CMD. The internal commands CAS1 and CAS2 may be provided to read enable circuit 128 and write enable circuit 128, which are discussed in further detail below. Although the internal commands are generally discussed with respect to CAS1 and CAS2, it should be noted that the internal commands are not limited to these commands. Generally, any internal commands generated by the command decoder 122 in response to an external command EXTERNAL_CMD can be used within the scope of the present disclosure. An example circuit of the command domain circuit 114 is discussed in further detail below with respect to FIG. 4A.

Figure 6:
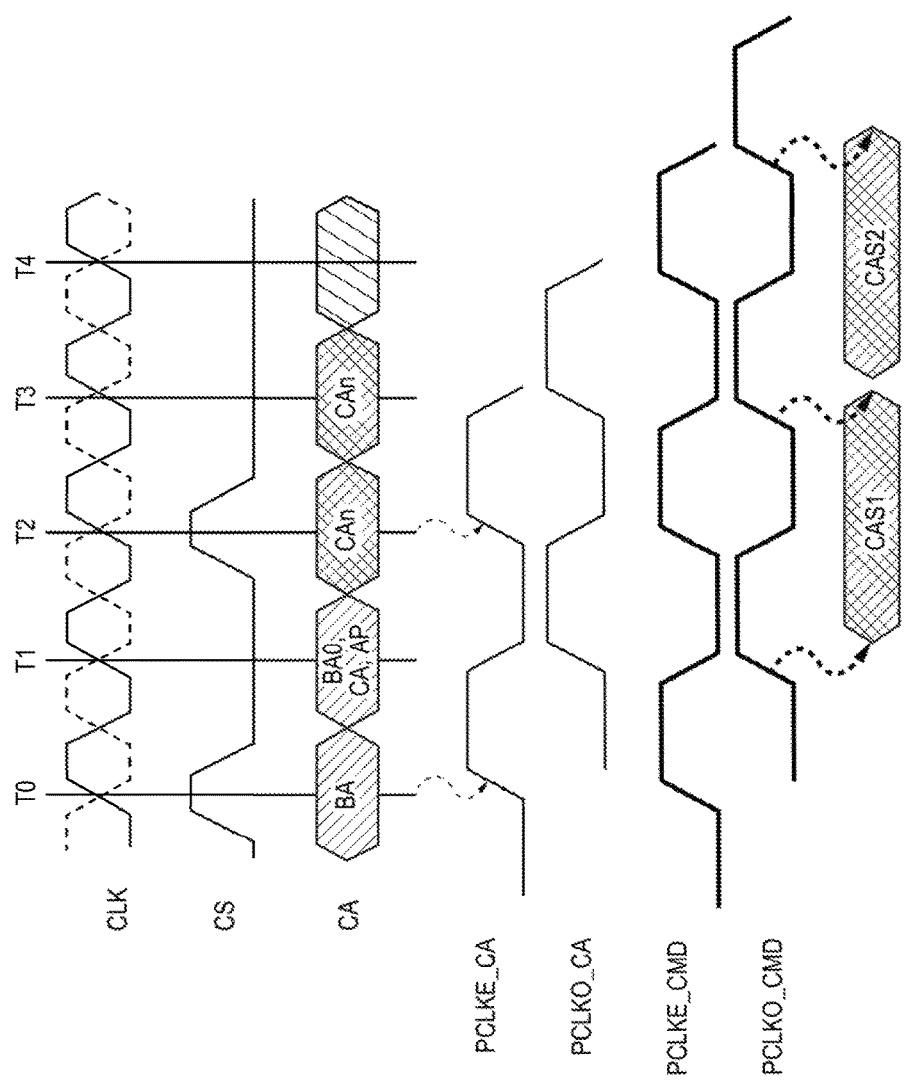
FIG. 6 is a timing diagram of a read command, in accordance with an embodiment of the present invention.

The extended chip select circuit 120 may be a sub-circuit of the clock control circuit that is configured to receive the even and odd clock signals PCLKE, PCLKO and the chip select signal CS. The extended chip select circuit may be configured to extend the chip select signal CS for a number of clock cycles of the even and odd clock cycles PCLKE, PCLKO to provide an extended chip select signal CS_EXT. The number of clock cycles by which the extended chip select circuit 120 extends the chip select signal CS may be based on the number of clock cycles needed to process the internal commands generated by the command decoder 122. For example, as shown in FIG. 6, the internal commands CAS1 and CAS2 are completed in three clock cycles of PCLK. Therefore, the extended chip select circuit 120 may extend the chip select signal CS to remain active for three periods of the clock signal PCLK. The extended chip select signal may be provided to the command domain circuit 114. An example circuit of the extended chip select circuit 120 is described in further detail, below with respect to FIG. 4A.

The column latency domain circuit 116 is a sub-circuit of the clock control circuit 104 that is configured to receive the even and odd clock signals PCLKE, PCLKO and one or more clock enable signals CLK_RD_ENf, CLK_WR_ENf. The column latency domain circuit 116 is further configured to selectively provide even and odd column latency clock signals PCLKE_CL, PCLKO_CL based on the clock enable signals CLK_RD_ENf, CLK_WR_ENf and the even and odd clock signals PCLKE, PCLKO. In various embodiments, the even column latency clock signal PCLKE_CL may be based on the even clock signal PCLKE, and the odd command clock signal PCLKO_CL may be based on the odd clock signal PCLKO. The even and odd column latency clock signals PCLKE_CL, PCLKO_CL may be provided to a column command latency shifter circuit 122 in the memory control circuit 108. An example circuit of the column latency domain circuit 116 is discussed in further detail below with respect to FIG. 5.

The read enable circuit 126 and the write enable circuit 128 are each circuits configured to provide enable signals to the column latency domain circuit 116 during a read burst and a write burst, respectively. Each of the read enable circuit 126 and the write enable circuit 128 are configured to receive the internal commands CAS1 and CAS2 from the command decoder 122. The read enable circuit 126 may be further configured to receive a read burst-in-progress signal READ_BIP that is active during a read burst. The write enable circuit 128 may be further configured to receive a write burst-in-progress signal WRITE BIP that is active during a write burst. In various embodiments, the read enable signal CLK_RD_ENf may be active when any of CAS1, CAS2, and READ_BIP are active. The write enable signal CLK_WR_ENf may be active when any of CAS1, CAS2, and WRITE SIP are active. The read enable circuit 126 and the write enable circuit 128 are discussed in further detail below with respect to FIGS. 8 and 9.

The column command latency shifter circuit 124 may be, for example, a counter that counts the latency of a command that involves a column access operation to a memory array of the LPDRAM device, such as a write command or a read command. For example, the internal commands CAS1 and CAS2 generated by the command decoder 122 involve column access strobes and may have associated latencies, or delays. After receiving a latency of one or both of the internal commands CAS1 and CAS2, the column command latency shifter circuit 124 may count a predetermined latency based on the even and odd column latency clock signals PCLKE_CL, PCLKE_CL and output the internal commands CAS1 and CAS2 to be executed by the LPDRAM device once the latency period has expired.

The four phase domain circuit 118 may be a sub-circuit of the clock control circuit 184. The four phase domain circuit 118 may be configured to receive the four phase clock signals CLK0, CLK90, CLK180, CLK 270, and the READ_BIP signal. The four phase domain circuit 118 may further be configured to provide a second four phase clock signal PCLK_0/90/180/270 to the output data buffer. In various embodiments, the LPDRAM device may be a double data rate device. That is, the output data buffer may be configured to provide data during a read burst on both the rising edge and falling edge of the external clock signal CLK. Because the external clock CLK may suffer from duty cycle skew on the falling edge, it may be beneficial to generate a four phase clock signal using only the rising edges of internal clocks having twice the period of the external clock. The second four phase clock signals PCLK_0/90/1801270 provide a set of signals having rising edges that align (i.e., have rising edges that occur at substantially the same time) with the rising and falling edges of the external clock CLK, without the falling edge skew. However, to conserve power, the second four phase clock signals PCLK_0/901180/270 may only be provided during a read burst. Therefore, the four phase domain circuit 118 may only provide the second four phase clock signals PCLK_0/90/180/270 only when the READ_BIP signal is active. The output data buffer 110 may be configured to provide data RD DATA in response to a read operation based on the rising edges of the second four phase clock signals PCLK_0/90/180/270. Referring again to FIG. 2, the READ_BIP signal and the second four phase clock signals PCLK_0/90/180/270 are shown. When the READ_BIP signal transitions to an active state (e.g., a logical high state), then the second four phase clock signals PCLK_0190/180/270 are provided by the four phase domain circuit 118. When the READ_BIP signal transitions to an inactive state (e.g., a logical low state), the four phase domain circuit 118 does not provide the second four phase clock signals PCLK_0/90/180/270.

Figure 3:
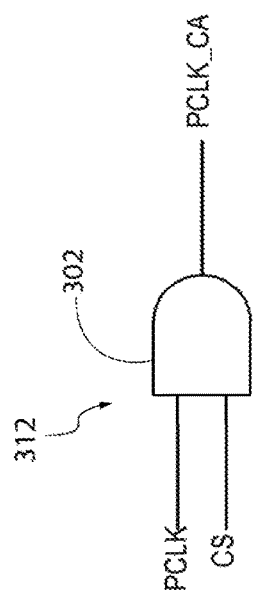
FIG. 3 is a schematic diagram of a command/address domain circuit, in accordance with an embodiment of the present invention.

FIG. 3 is a schematic diagram of a CA domain circuit, generally designated 312, in accordance with an embodiment of the present invention. In various embodiments, the CA domain circuit 312 may be implemented as the CA domain circuit 112 of FIG. 1. The CA domain circuit 312 includes an AND gate 302. The AND gate 302 may be configured to receive a clock signal PCLK and a chip select signal and to provide a CA clock signal PCLK_CA. In various embodiments, the clock signal PCLK may be one of the clock signals PCLKE or PCLKO. In some embodiments, the CA domain circuit 312 includes two AND gates 302. One of the AND gates 312 may be configured to receive the even clock signal PCLKE and to provide an even CA dock signal PCLKE_CA to the CA latch 106. The second AND gate 302 may be configured to receive the odd clock signal PCLKO and to provide the odd CA dock signal PCLKO_CA to the CA latch 106. Because the output of the AND gate 302 is based on both the chip select signal CS and the clock signal PCLK, the CA clock signal PCLK_CA is provided only when the chip select signal CS is in an active state. Therefore, the CA latch 106 will only latch an incoming command when the chip select signal CS is active. By limiting the time during which the CA clock signal PCLK_CA is provided to the CA latch 106, power consumption may be reduced. In various embodiments, the chip select signal CS may be active for a single period of the external clock CLK and a half period of the clock signal PCLK. Therefore, the CA clock signal PCLK_CA may only be provided to the CA latch 106 for a long enough time period to latch the incoming command.

Figure 4A:
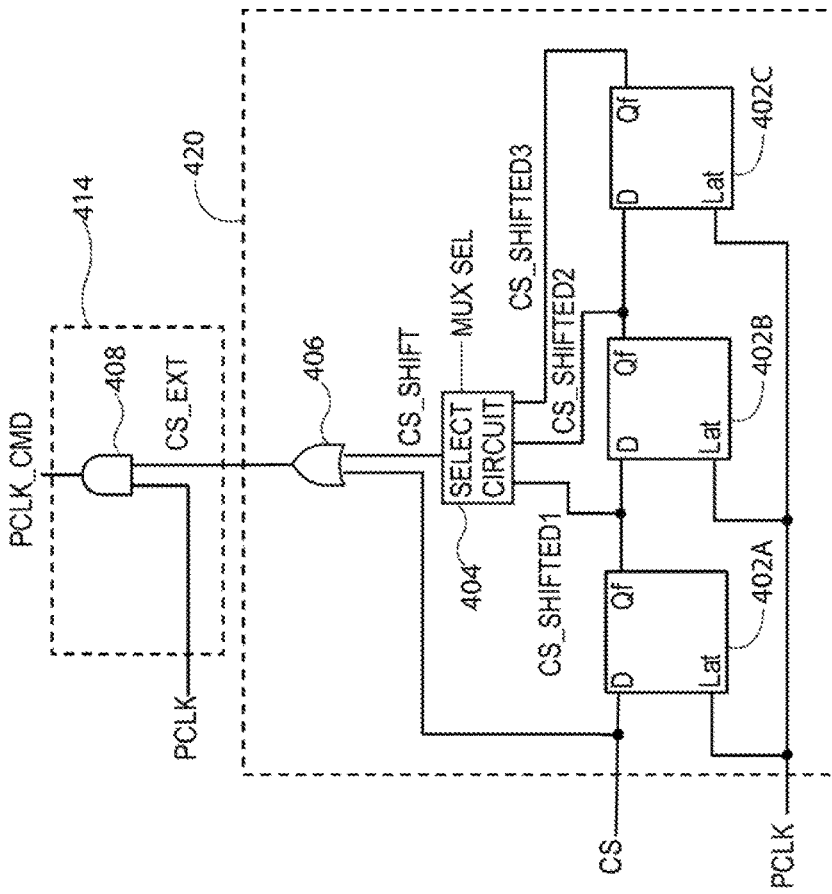
FIG. 4A is a schematic diagram of an extended chip select circuit and a command domain circuit, in accordance with an embodiment of the present invention.

FIG. 4A is a schematic diagram of an extended chip select circuit 420 and a command domain circuit 414, in accordance with an embodiment of the present invention. In various embodiments, the extended chip select circuit 420 may be implemented as the extended chip select circuit 120, and the command domain circuit 414 may be implemented as the command domain circuit 114. As discussed above with respect to FIG. 3, the chip select signal may be a pulse signal having a duration of one half period of the clock signal PCLK. However, generating internal commands in response to the command latched by the CA latch 106 may use multiple periods of the clock signal PCLK. As recognized by several embodiments disclosed herein, it may be desirable to control the provision of several clock signals based on the chip select signal. However, the generation of internal commands may use more clock periods than the chip select signal CS typically lasts. Therefore, the chip select signal CS may be extended by the extended chip select circuit 420.

The extended chip select circuit 420 may include a number of latches 402A-C, a select circuit 404, and an OR gate 406. The chip select signal CS may be coupled to the data input terminal of the first latch 402A. The output terminal of each latch 402 may be provided to the data input terminal of a subsequent latch 402. For example, the first latch 402A may be configured to provide its output to a second latch 402B, which may be configured to provide its output to a third latch 402C, etc. The output terminals of the latches 402 may also be coupled to the select circuit 404. Each latch 402 is configured to provide a shifted chip select signal (e.g., CS_SHIFTED1, CS_SHIFTED2, CS_SHIFTED3). The clock signal PCLK may be coupled to the latch terminals of the latches 402. In operation, the latches 402 may be configured to shift the chip select signals CS by a number of clock cycles. For example, the output of the first latch 402 (i.e., shifted chip select signal CS_SHIFTED1) may be the chip select signal CS shifted by one clock cycle, the output of the second latch 402 (e.g., shifted chip select signal CS_SHIFTED2) may be the chip select signal CS shifted by two clock cycles, the output of the third latch 402 (e.g., shifted chip select signal CS_SHIFTED3) may be the chip select signal shifted by three clock cycles, etc. Although three latches 402 are shown in FIG. 4A, those skilled in the art will understand that any number of latches may be used to shift the chip select signal CS.

The select circuit 404 may be configured to select the output of one of the latches 402 to provide to the OR gate 406 as the CS_SHIFT signal. In various embodiments, the particular shifted chip select signal provided to the OR gate 406 by the select circuit 404 as the CS_SHIFT signal is based on a MUX SEL signal. The MUX SEL signal may be programmed by fuse during fabrication or may be configurable by a user. In general, MUX SEL signal may select the shifted select signal based on the number of clock periods of the clock signal PCLK needed to execute a sequence of internal commands (e.g., CAS1 and CAS2) associated with the external command EXTERNAL_CMD. For example, if a sequence of internal commands associated with an external command requires three clock periods of the clock signal PCLK to complete, then the select circuit 404 may provide the output of a second latch 402, which provides a shifted chip select signal such that one or both of the chip select signal CS and the shifted chip select signal CS_SHIFTED the shifted chip select signal is active for as long as needed to process the internal commands (e.g., CAS1 and CAS2).

Figure 4B:
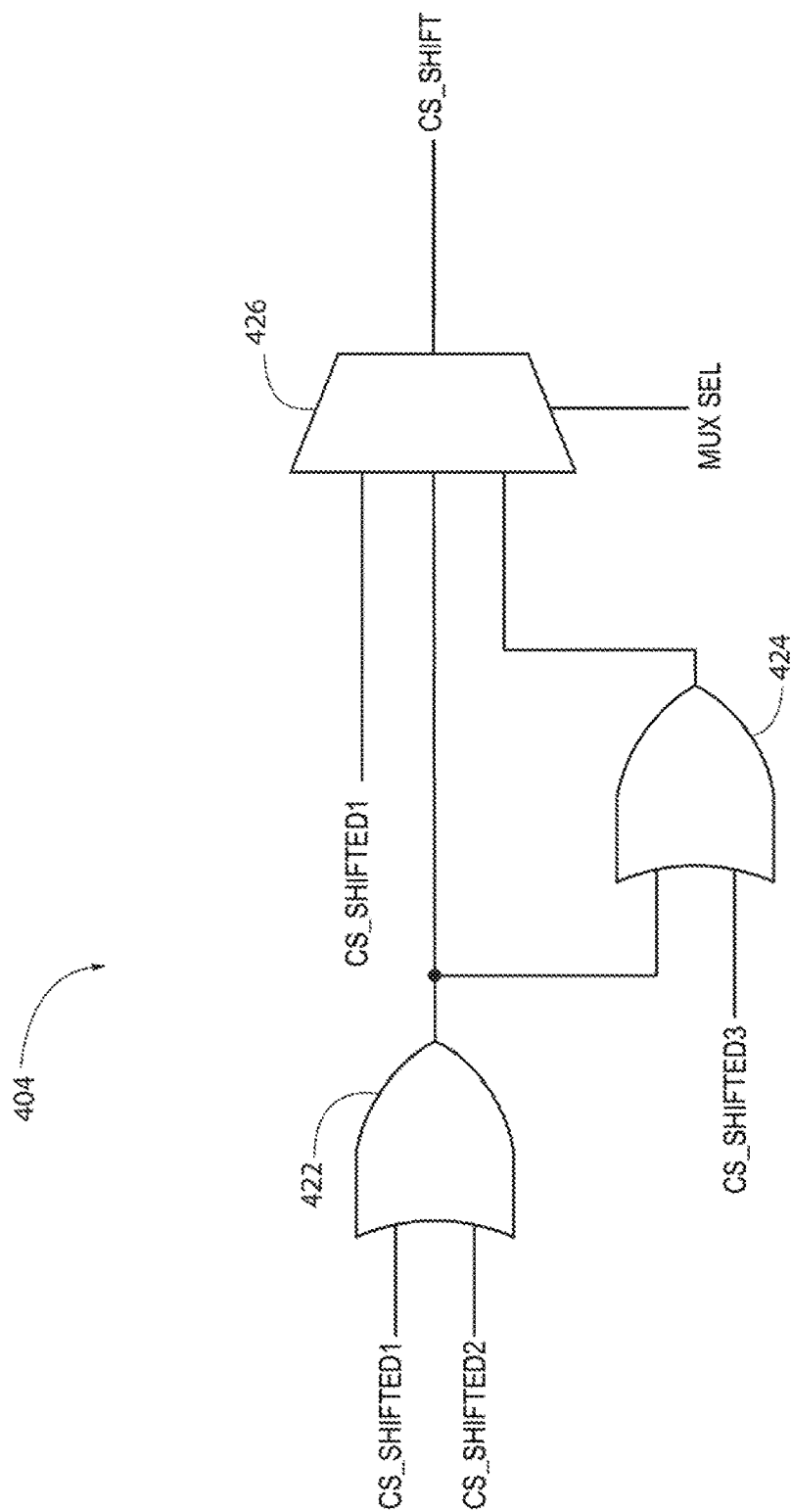
FIG. 4B is a schematic diagram of an example select circuit, in accordance with the embodiment of FIG. 4A.

FIG. 4B is a schematic diagram of an example select circuit 404, in accordance with the embodiment of FIG. 4A. The select circuit 404 includes first and second OR gates 422 and 424 and a MUX 426. The input terminals of the first OR gate 422 are configured to receive the CS_SHIFTED1 and CS_SHIFTED2 signals from the first latch 402A and the second latch 402B, respectively. The output terminal of the first OR gate 422 is coupled to an input terminal of the second OR gate 424 and to a first input terminal of the MUX 426. A second input terminal of the second OR gate 424 is configured to receive the CS_SHIFTED3 signal from the third latch 402C. The output terminal of the second OR gate 424 is coupled to a second input terminal of the MUX 426. A third input terminal of the MUX 426 is configured to receive the CS_SHIFTED1 signal from the first latch 402A. The MUX SEL signal is provided to a select terminal of the MUX 426 and is configured to select from one of the signals coupled to the input terminals of the MUX 426 to provide as the CS_SHIFT signal. As discussed above, the MUX SEL signal may select the shifted select signal based on the number of clock periods of the clock signal PCLK needed to execute a sequence of internal commands (e.g., CAS1 and CAS2) associated with the external command EXTERNAL_ CMD.

The OR gate 406 may be configured to receive the chip select signal CS and the shifted chip select signal provided by the select circuit 404. The OR gate 406 may be further configured to provide an extended chip select signal CS_EXT that is active from the time the chip select signal CS becomes active until the shifted chip select signal transitions to an inactive state.

Figure 5:
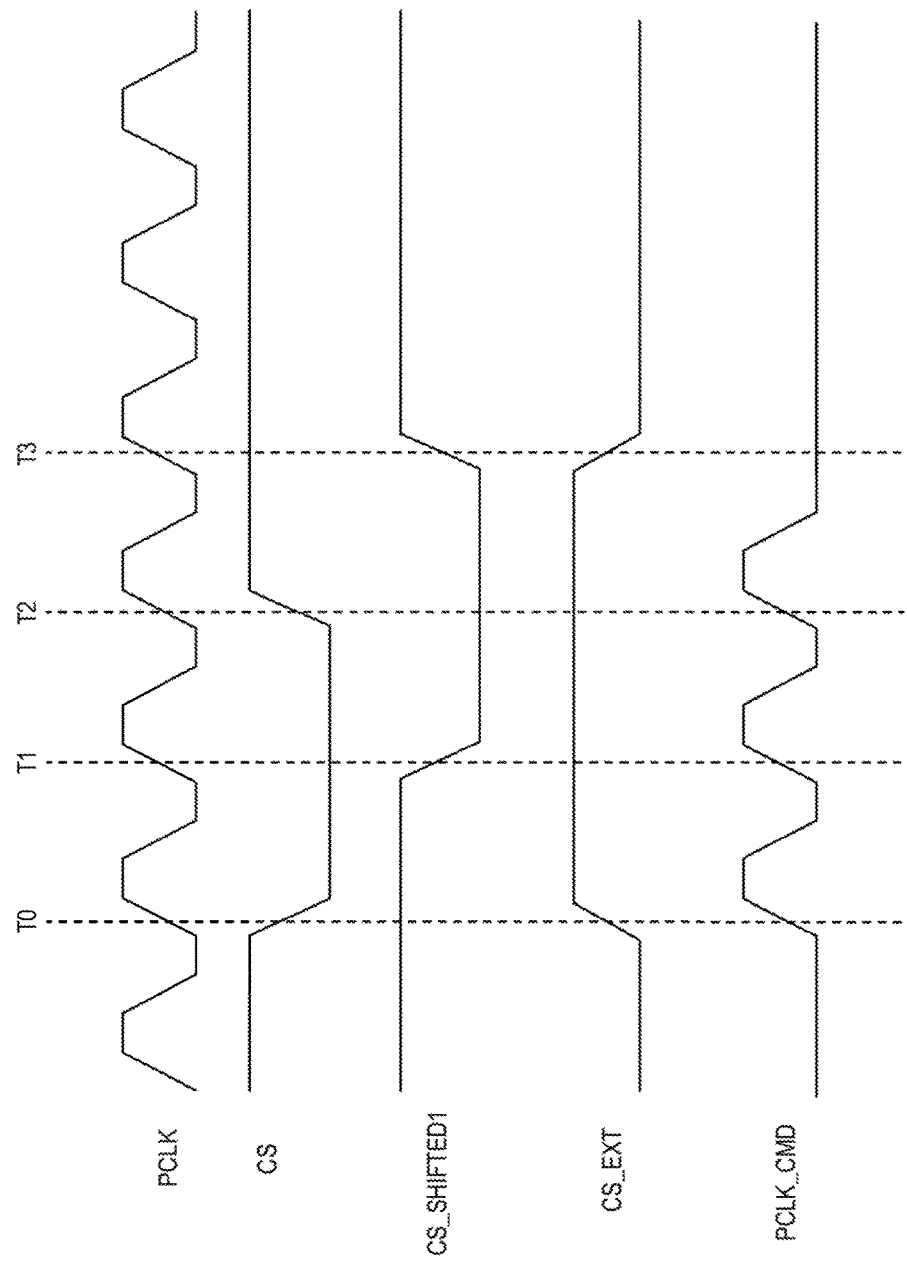
FIG. 5 is a timing diagram of the input and output clock signals of the command domain circuit of FIG. 1, in accordance with an embodiment of the present invention.

FIG. 5 is a timing diagram of the input and output clock signals of the extended chip select circuit 420 and the command domain circuit 414 of FIG. 4A, in accordance with an embodiment of the present invention. The clock signal PCLK and the chip select signal CS may be generated as described above. The shifted chip select signal CS_SHIFTED1 may be identical to the chip select signal CS shifted by one periods of the clock signal PCLK. The extended chip select signal CS_EXT, provided by the OR gate 406 of FIG. 4A, may transition to an active state when the chip select signal CS transitions to the active state, as shown at time T0. As shown in FIG. 5, the command clock signal PCLK_CMD is in phase with the clock signal PCLK and is provided when the extended chip select signal CS_EXT is active. The extended chip select signal CS_EXT may transition to the inactive state when the shifted chip select signal CS_SHIFTED transitions to the inactive state at time T3. That is, as long as one of the chip select signal CS and the shifted chip select signal CS_SHIFTED2 is in the active state, the extended chip select signal CS_EXT is in the active state between times T0 and T3. As shown in FIG. 5, the chip select signal CS and the shifted chip select signal CS_SHIFTED1 may be active low while the extended chip select signal CS_EXT may be active high.

With reference again to FIG. 4A, the command domain circuit 414 includes an AND gate 408. The AND gate 408 is configured to receive the dock signal PCLK and the extended chip select signal CS_EXT. The AND gate 408 is further configured to provide the command clock signal PCLK_CMD. The AND gate 408 is configured to provide the command clock signal PCLK_CMD, which may be the same as the clock signal PCLK, when the extended chip select signal is in an active state.

FIG. 6 is a timing diagram of a read command, in accordance with an embodiment of the present invention. At time T0, the chip select signal CS has an active state and bank address information is provided on the CA bus. The bank address information BA may be latched by the CA latch 106 at the rising edge of the even CA clock signal PCLKE_CA. In various embodiments, internal command CAS1 may be generated in response to the received bank address information BA. The internal command CAS2 may be generated at time T2 in response to an external command CAn being latched by the CA latch 106. In various embodiments, the internal commands may be generated by the command decoder 122 based on command clock signals PCLK_CMD.

In some embodiments, the polarity of the CA clock signal PCLK that is used to latch the command is the opposite of the polarity of the command clock signal that is used to generate the internal commands. For example, in FIG. 6, the even CA clock signal PCLKE_CA is employed to latch the bank address information with the CA latch 106. Based on the received bank address information, the command decoder 122 generates an internal command CAS1 based on the odd command clock signal PCLKO_CMD. The rising edge of the odd command clock PCLKO_CMD is the first rising edge of a command clock signal following the even CA clock signal PCLKE_CA. By using the next rising clock edge of the command clock signal PCLK_CMD, the internal commands may be generated in the same time period as if the commands were generated by the external clock signal CLK. However, because the command clock signals PCLK_CMD have periods twice as long as the external clock signal CLK, adverse effects resulting from duty cycle skew can be reduced. Alternatively, if the odd CA clock signal PCLKO_CA is used to latch the external command or the bank address information BA, then the even command clock signal PCLKE_CMD is used to generate the internal command CAS1. Similar operations are performed with respect to the second internal command CAS2. The even CA clock signal PCLKE_CA latches the information CAn with the CA latch 106 at time T2. The command decoder 122 generates the internal command CAS2 based on the odd command clock signal PCLKO_CMD. Although FIG. 6 shows the even CA clock signal PCLKE_CA latching the received commands and the odd command clock signal PCLKO_CMD used to generate the internal commands, those skilled in the art will appreciate that the odd CA clock signal PCLKO_CA may be used to latch the received commands and the even command clock signal PCLKE_ CMD may be used to generate the internal commands. In general, the first CA clock signal PCLK_CA (PCLKE_CA or PCLKO_CA) to occur after the bank address information (or other command information) is posted on the CA bus latches the information, and the next command clock signal PCLK_CMD (PCLKO_CMD or PCLKE_CMD) is used to generate the internal commands.

Figure 7A:
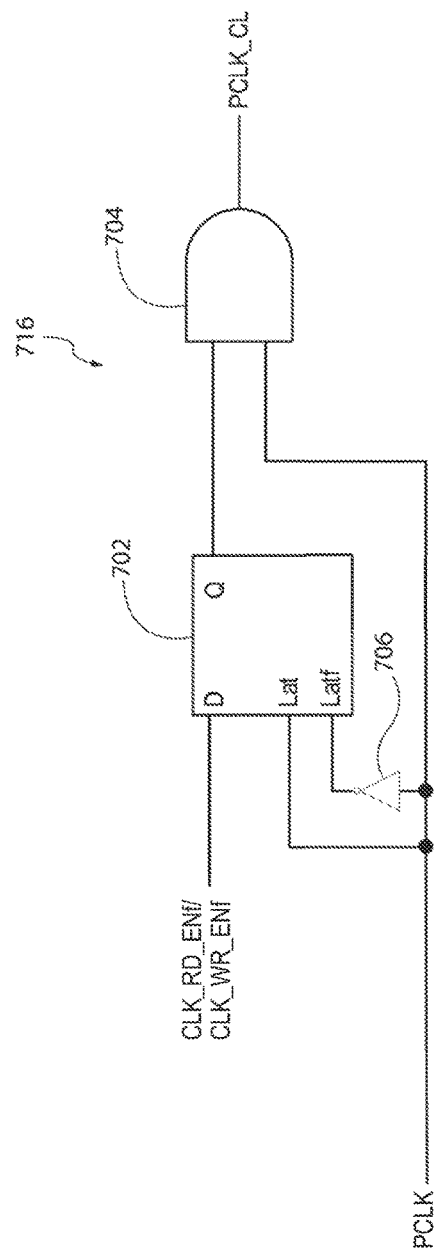
FIG. 7A is a schematic diagram of a column latency domain circuit, in accordance with an embodiment of the present invention.

FIG. 7A is a schematic diagram of a CL domain, generally designated 716, in accordance with an embodiment of the present invention. The CL domain is configured to provide consecutive clock signals to allow for latency control during various memory operations. The CL domain 716 includes a latch 702, an AND gate 704, and an inverter 706. The latch 702 may receive at a data input terminal the read enable signal CLK_RD_ENf and/or the write enable signal CLK_WR_ENf. The clock signal PCLK may be provided to the latch input terminal, Lat, of the latch 702 and to an input terminal of the inverter 706. The output terminal of the inverter 706 may be coupled to the inverting latch input terminal Latf of the latch 702. The output terminal of the latch 702 may be coupled to a first input terminal of the AND gate 704. The clock signal PCLK may be provided to a second input terminal of the AND gate 704. The AND gate 704 may be configured to provide the CL clock signal PCLK_CL. In operation, the latch 702 provides the read enable signal CLK_RD_ENf or the write enable signal CLK_WR_ENf to the AND gate 704 responsive to the falling edge of the dock signal PCLK The falling edge of the dock signal PCLK may be used to trigger the latch in order to remove an potential glitch in the CL clock signal PCLK_CL resulting from the read enable signal CLK_RD_ENf or the write enable signal CLK_WR_ENf entering an active state in the middle of a pulse of the clock signal PCLK. When the read enable signal CLK_RD_ENf or the write enable signal CLK_WR_ENf is active, the AND gate 704 provides the CL clock signal PCLK_CL having the same period as the clock signal PCLK. The read enable signal CLK_RD_ENf and the write enable signal CLK_WR_ENf are discussed in further detail with respect to FIGS. 8 and 9, respectively.

Figure 7B:
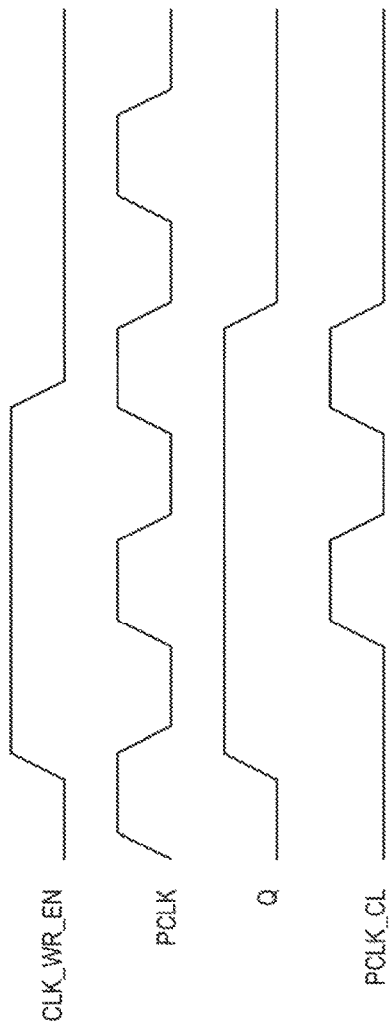
FIG. 7B is a timing diagram of an example column latency domain circuit, in accordance with the embodiment of FIG. 7A.

FIG. 7B is a timing diagram of an example CL domain circuit operating during a write operation, in accordance with the embodiment of FIG. 7A. When the CLK_WR_SIGNAL is active (e.g., when CAS1, CAS2, or the WRITE_BIP signal is active), a falling edge of the clock signal PCLK triggers the output signal Q of the latch 702 to become active, the CL clock signal PCLK_CL is provided by the AND gate 704. When the CLK_WR_EN signal transitions to an inactive state, the output signal Q of the latch 702 transitions to inactive at the next falling edge of the clock signal PCLK. At this point, the CL clock signal PCLK_CL is no longer provided by the AND gate 704.

Figure 8:
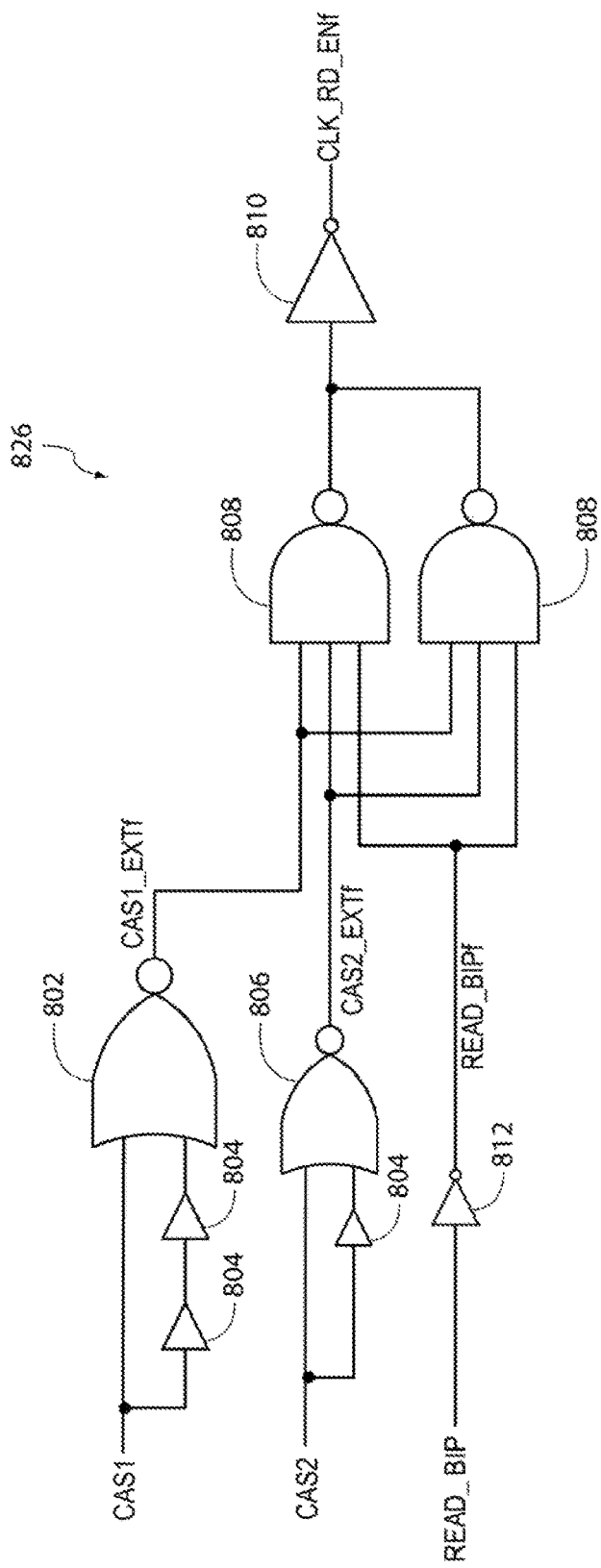
FIG. 8 is a schematic diagram of a read enable circuit, in accordance with an embodiment of the present invention.
Figure 10:
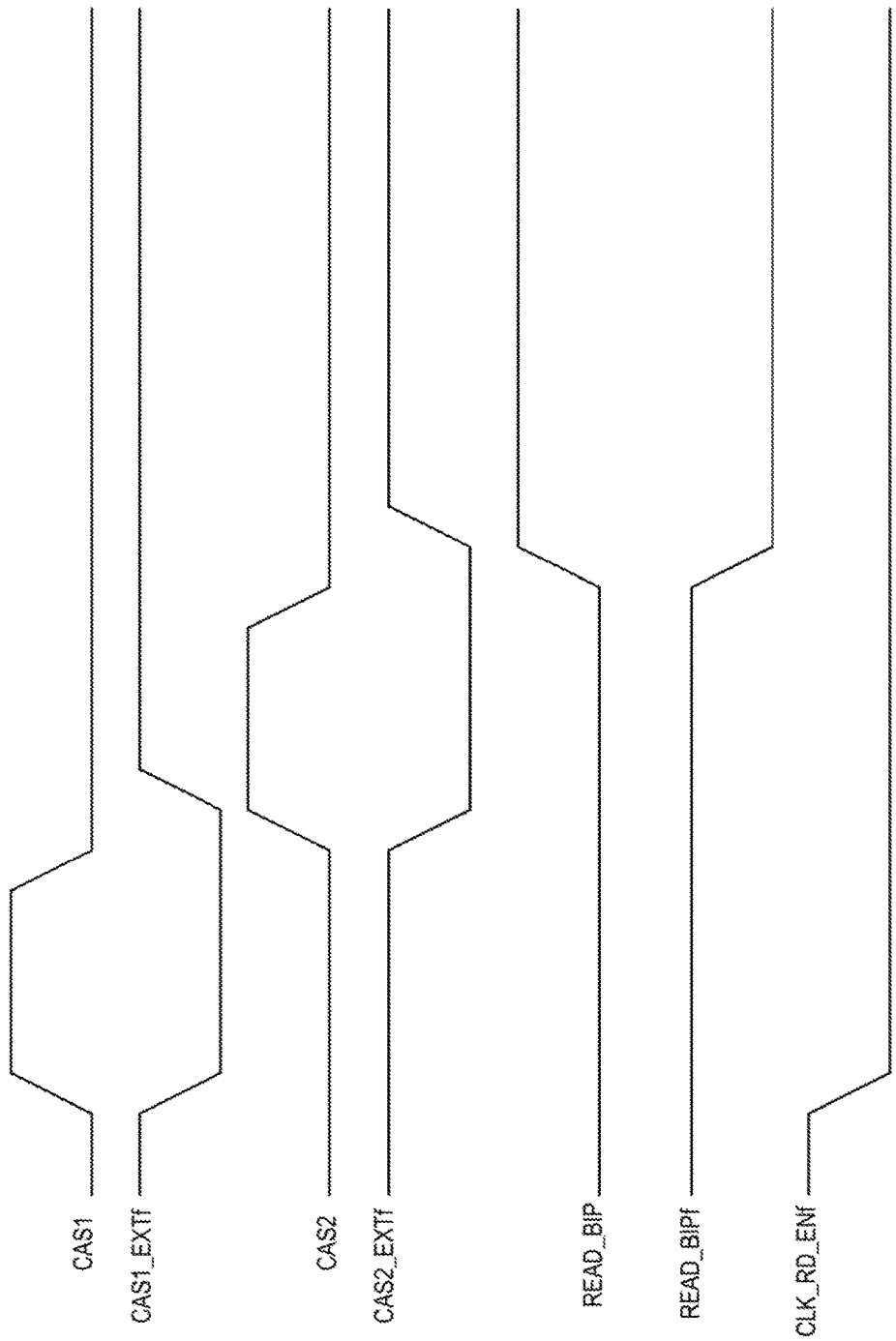
FIG. 10 is a timing diagram of the input and output signals of the read enable circuit of FIG. 8.

FIG. 8 is a schematic diagram of a read enable circuit, generally designated 826, in accordance with an embodiment of the present invention. The read enable circuit 826 may be implemented as the read enable circuit 126 of FIG. 1. FIG. 10 is a timing diagram of the input and output signals of the read enable circuit of FIG. 8. The read enable circuit 826 is generally configured to provide a read enable signal CLK_RD_ENf based on the internal commands CAS1 and CAS2 and the READ_BIP signal. As shown in FIG. 10, the CAS1 and CAS2 are typically non-overlapping pulse signals. The READ_BIP signal typically becomes active after the CAS2 signal becomes inactive. However, for latency control, continuous, consecutive clock cycles from the CL clock domain circuit 116 may be preferable. To prevent discontinuities in the CL clock signal PCLK_CL, the internal commands CAS1 and CAS2 may be extended to slightly overlap one another and the READ_BIP signal. The overlapping signals may then be used to provide a continuous read enable signal CLK_RD_ENf whenever the overlapping signals are active. By using the continuous read enable signal CLK_RD_ENf to gate the clock signal PCLK with the AND gate 704 in FIG. 7, the CL domain circuit 716 may provide consecutive clock signals to the column command latency shifter circuit 124.

The read enable circuit 826 includes NOR gates 802 and 806, buffers 804, an inverter 812, NAND gates 808, and an inverter 810. To generate the extended CAS1 signal CAS1_EXTf, the CAS1 signal may be provided to an input terminal of the NOR gate 802 and to a number of series coupled buffers 804. The series coupled buffers 804 may be coupled to a second input terminal of the NOR gate 802. Because the buffers 804 delay the CAS1 signal, the active output signal of the NOR gate 802 is extended relative to the CAS1 command. In various embodiments, the number of buffers 804 and delay provided by the buffers 804 may be selected so as to ensure that the extended CAS1 signal CAS1_EXTf remains active (e.g. logical low) long enough to overlap with the rising edge of the CAS2 signal.

Similarly, the CAS2 signal may be extended to provide an extended CAS2 signal CAS2_EXTf. The CAS2 signal may be extended by providing the CAS2 signal to an input terminal of the NOR gate 806 and to a buffer 804. The buffer 804 may be coupled to a second input terminal of the NOR gate 806. Because the CAS2 signal is delayed by the buffer 804, the output of the NOR gate 806 (extended CAS2 signal CAS2_EXTf) may be extended relative to the CAS2 signal. The delay provided by the buffer 804 may be selected so as to ensure that the extended CAS2 signal CAS2_EXTf remains active long enough to overlap with the active edge of the READ_BIP signal.

The READ_BIP signal may be provided to an input terminal of the inverter 812. The inverter 812 may provide at an output terminal a READ_BIPf signal, which is logically inverted from the READ_BIP signal.

The extended CAS1 signal CAS1_EXTf, the extended CAS2 signal CAS2_EXTf, and the READ_BIPf signal may be provided to a pair of parallel >coupled NAND gates 808. The outputs of the NAND gates 808 are commonly coupled to the input terminal of the inverter 810. The inverter 810 may have a large drive strength to improve the speed at which the CLK_RD_ENf signal is provided to the CL domain circuit. When any one of the extended CAS1 signal CAS1_EXTf, the extended CAS2 signal CAS2_EXTf, and the READ_BIPf signal is active (e.g., logical low), the NAND gates 808 provide an inactive signal and the inverter 810 provides an active clock read enable signal CLK_RD_ENf (e.g., logical low). Similarly, if all of the extended CAS1 signal CAS1_EXTf, the extended CAS2 signal CAS2_EXTf, and the READ_BIPf signal are inactive, the NAND gates 808 provide an active signal and the inverter 810 provides an inactive clock read enable signal CLK_RD_ENf (e.g., logical high). Two or more NAND gates 808 may be used in order to improve fan out of the clock read enable signal CLK_RD_ENf.

Figure 9:
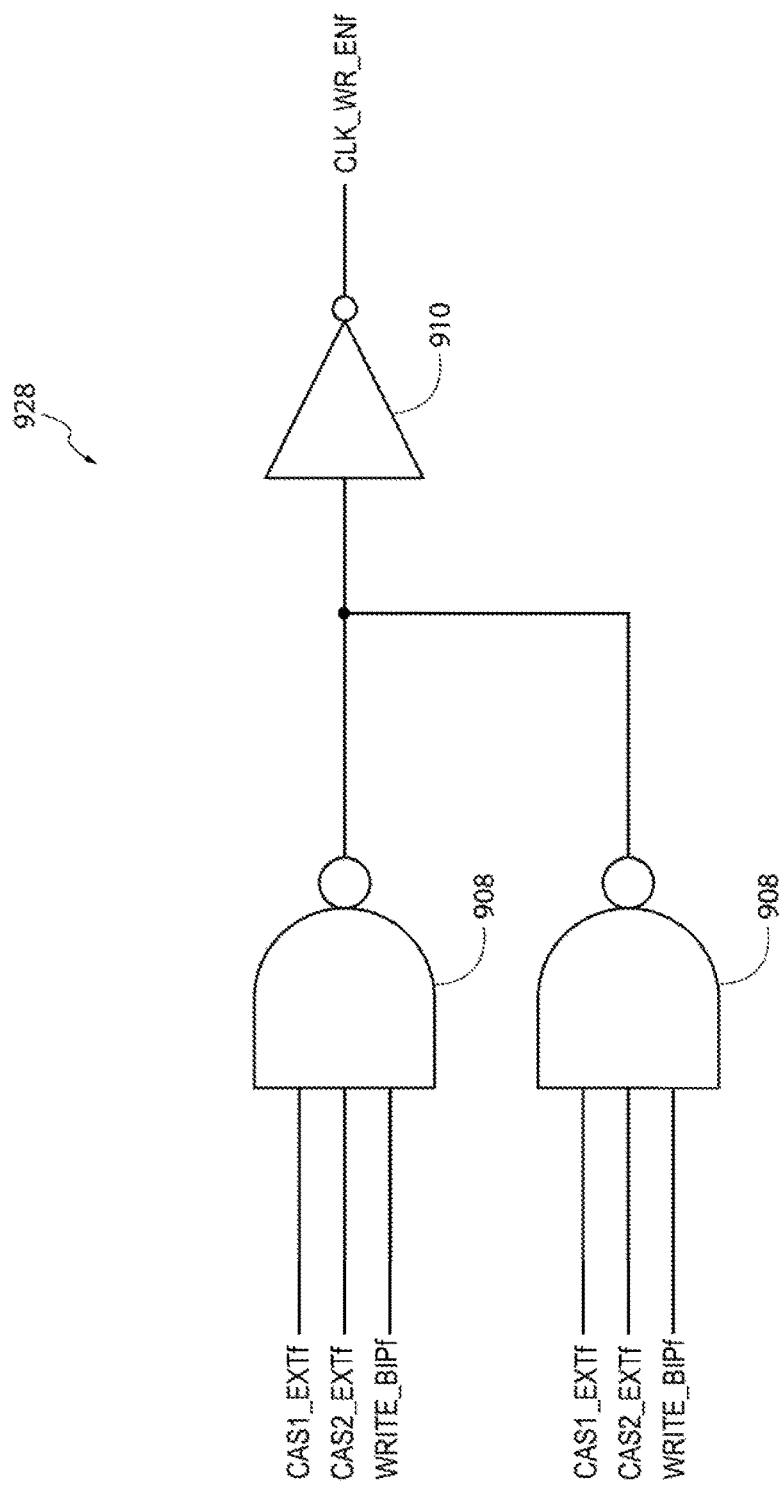
FIG. 9 is a schematic diagram of a write enable circuit, in accordance with an embodiment of the present invention.

FIG. 9 is a schematic diagram of a write enable circuit, generally designated 928, in accordance with an embodiment of the present invention. The write enable circuit 928 may be implemented as the write enable circuit 128 of FIG. 1. The write enable circuit 928 may include NAND gates 908 and an inverter 910. The write enable circuit 928 may function in substantially the same manner as the read enable circuit 826 of FIG. 8, with the exception that the WRITE_BIPf signal is used as the input signal instead of the READ_BIPf signal. The extended CAS1 signal CAS1_EXTf and the extended CAS2 signal CAS2_EXTf may be generated in the same manner as described above with respect to FIG. 8, except that the CAS2 signal is extended so as to overlap with the rising edge of the WRITE BIPf signal. The extended CAS1 signal CAS1_EXTf, the extended CAS2 signal CAS2_EXTf, and the WRITE_BIPf signal may be provided to the NAND gates 908. The outputs of the NAND gates may be commonly coupled to the input terminal of the inverter 910, which provides an active write enable signal CLK_WR_ENf (e.g., logical low) when any of the extended CAS1 signal CAS1_EXTf, the extended CAS2 signal CAS2_EXTf, and the WRITE_BIPf signal are active (e.g., logical low).

Figure 11:
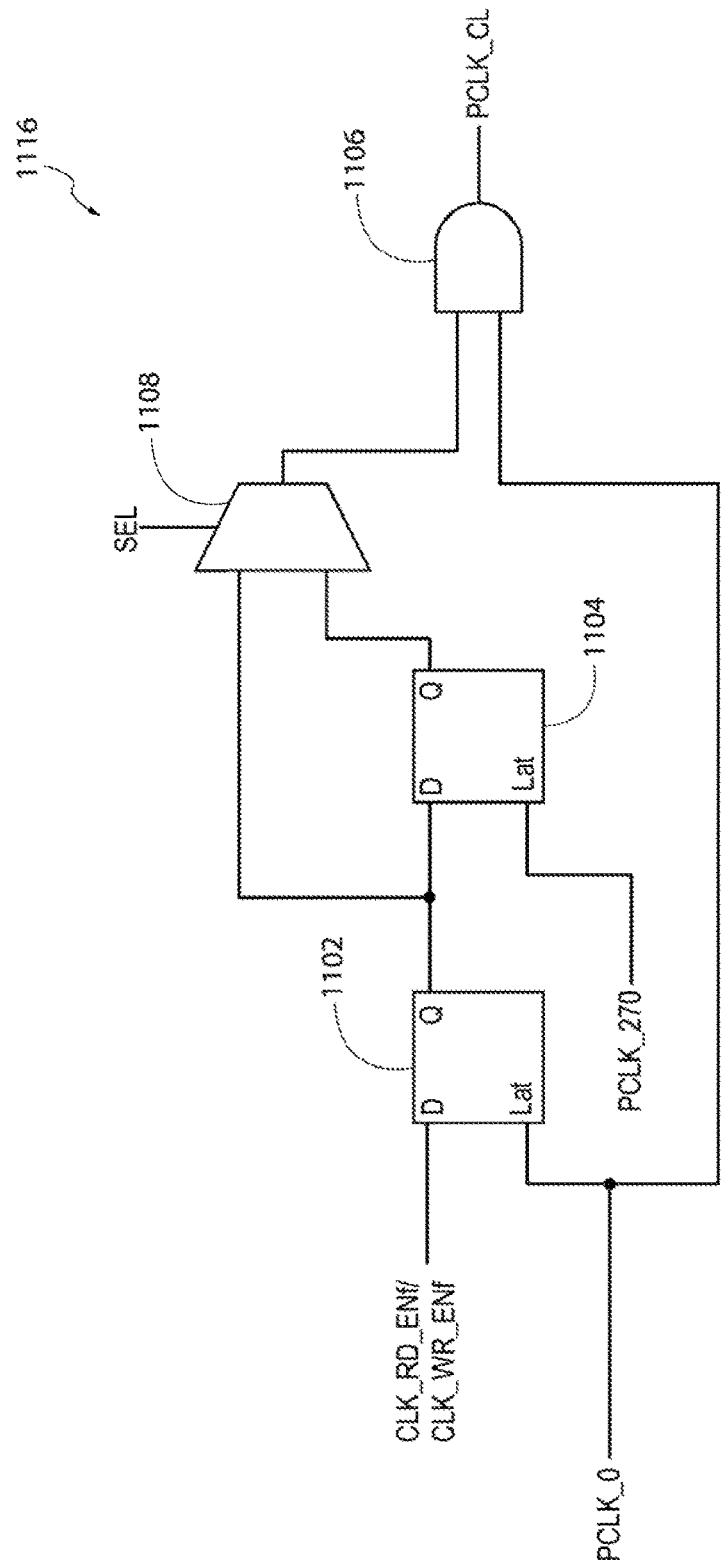
FIG. 11 is a schematic diagram of a column latency domain circuit, in accordance with an embodiment of the present invention.

FIG. 11 is a schematic diagram of a column latency domain circuit, generally designated 1116, in accordance with an embodiment of the present invention. Many traditional latches suffer from an issue known as metastability, in which data does not arrive at a latch sufficiently ahead of a clock trigger to guarantee a valid output. In order to properly latch data, the data must arrive at the input terminal a particular amount of time before the latch is triggered to provide the data by a latch signal. Similarly, the data must remain stable for a particular period of time afterwards to ensure that the data is properly transferred to the output terminal of the latch. In the embodiment of the CL domain shown in FIG. 7A, the clock signal PCLK is aligned with the read enable signal CLK_RD_ENf and the write enable signal CLK_WR_ENf. Because the signals are aligned, there is a chance that the read enable signal CLK_RD_ENf or write enable signal CLK_WR_ENf will not arrive at the data input terminal of the latch 702 sufficiently before the clock signal PCLK to ensure that the enable signal is properly transferred to the output terminal and the AND gate 704. The embodiment of FIG. 11 describes an alternative CL domain that accounts for the metastable possibility of the latch 702.

The CL domain 1116 includes a first latch 1102, a second latch 1104, an AND gate 1106, and multiplexer 1108. Except as otherwise noted below, the first latch 1102 and the AND gate 1106 may be implemented in substantially the same manner as the latch 702 and the AND gate 704 of FIG. 7A. In the embodiment of FIG. 11, the output of the first latch 1102 may be coupled to the data input terminal of the second latch 1104 and to a first input terminal of the multiplexer 1108. The output of the second latch 1104 may be coupled to a second input terminal of the multiplexer 1108. The latch terminal of the latch 1104 may be coupled to a second clock signal having a phase that is delayed relative to the clock signal PCLK_0 used to latch the first latch 1102. As shown in FIG. 1102, the second clock signal may be the PCLK_270 provided by the four phase domain circuit 118 of FIG. 1. In such an embodiment, the phase of the second clock signal is delayed by 270 degrees relative to the first clock signal PCLK_0 that latches the first latch 1102. By delaying the time that the second latch 1104 latches the output of the first latch 1102, sufficient time is provided for the data to be provided to the data input terminal of the second latch 1104 to avoid the metastable state. The multiplexer 1108 may be used to select the output of one of the first latch 1102 and the second latch 1104 to provide to the AND gate 1106. The necessity of the second latch 1104 may be determined during testing of the LPDRAM device. Based on the results of the test, the select signal SEL may be programmed to couple the output of either the first latch 1102 or the second latch 1104 to the AND gate 1106. The select signal SEL may be programmed, example, as a test mode fuse/antifuse. In various embodiments, the multiplexer 1108 may be omitted, and the output of the second latch 1104 may be provided directly to the AND gate 1106.

Figure 12:
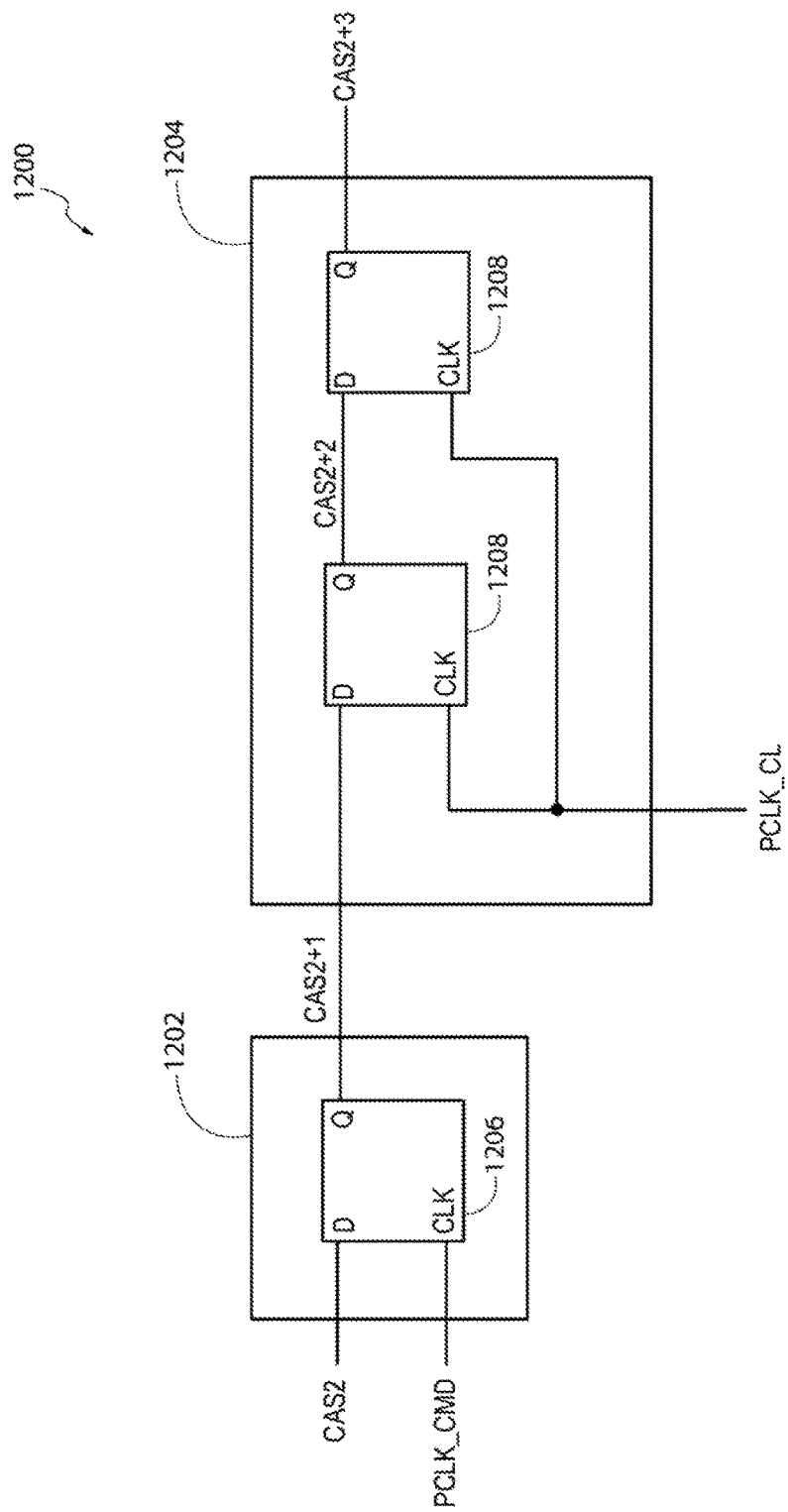
FIG. 12 is a schematic diagram of a latency shifter circuit, in accordance with an embodiment of the present invention.

FIG. 12 is a schematic diagram of a latency shifter circuit, generally designated 1200, in accordance with an embodiment of the present invention. The latency shifter circuit 1200 may be implemented as part of the Memory control circuit 108 of FIG. 1. In various embodiments, the latency shifter circuit 1200 provides an alternative circuit for avoiding the metastable possibility described above with respect to FIG. 11. Generally, the latency shifter circuit 1200 uses a cycle of the command clock signal PCLK_CMD to provide an initial shift of the CAS2 command. By shifting the CAS2 command, a delay is created between the CAS1 and CAS2 commands. Because the CAS2 command is delayed relative to the CAS1 command, any adverse effects of a glitch caused in the CL domain described above with respect to FIG. 7A can be avoided because the glitch will have ended by the time the CAS2 command arrives.

The latency shifter 1200 generally includes a command shifter circuit 1202 and a column command shifter circuit 1204. The command shifter circuit 1202 is configured to provide an initial shift to the CAS2 command based on the command clock signal PCLK_CMD. The command shifter circuit 1202 includes a flip flop 1206 that receives the CAS2 command at a data input terminal and the command clock signal PCLK_CMD at the CLK input terminal. To implement the latency shifter circuit 1200, the command clock signal PCLK_CMD may be extended for at least one extra clock period than is necessary to provide the clock for generating internal commands CAS1 and CAS2. Once the CAS2 command has been generated based on an earlier command clock signal PCLK_CMD pulse, the additional command clock signal PCLK_CMD pulse triggers the flip flop 1206 to provide the CAS2 command at the output terminal. The flip flop 1206 provides a delayed CAS2 command CAS2 +1 as an output signal. The delayed CAS2 command CAS2 +1 may be provided to the column command shifter circuit 1204. The column command shifter circuit 1204 may include additional flip flops 1208. A first additional flip flop 1208 may be configured to receive the delayed CAS2 command CAS2 +1 at a data input terminal. The first additional flip flop 1208 may also receive the CL clock signal PCLK_CL at the CLK input terminal. The output of the first additional flip flop 1208 may be coupled to the data input terminal of a second additional flip flop 1208. The additional flip flops 1208 may provide additional delays to the delayed CAS2 command CAS2 +1 based on the CL clock signal PCLK_CL (e.g., signals CAS2 +2 and CAS2 +3). The output of the column command shifter circuit 1204 may be processed to perform memory operations within the LPDRAM device, such as reading or writing data from a memory array.

Figure 13:
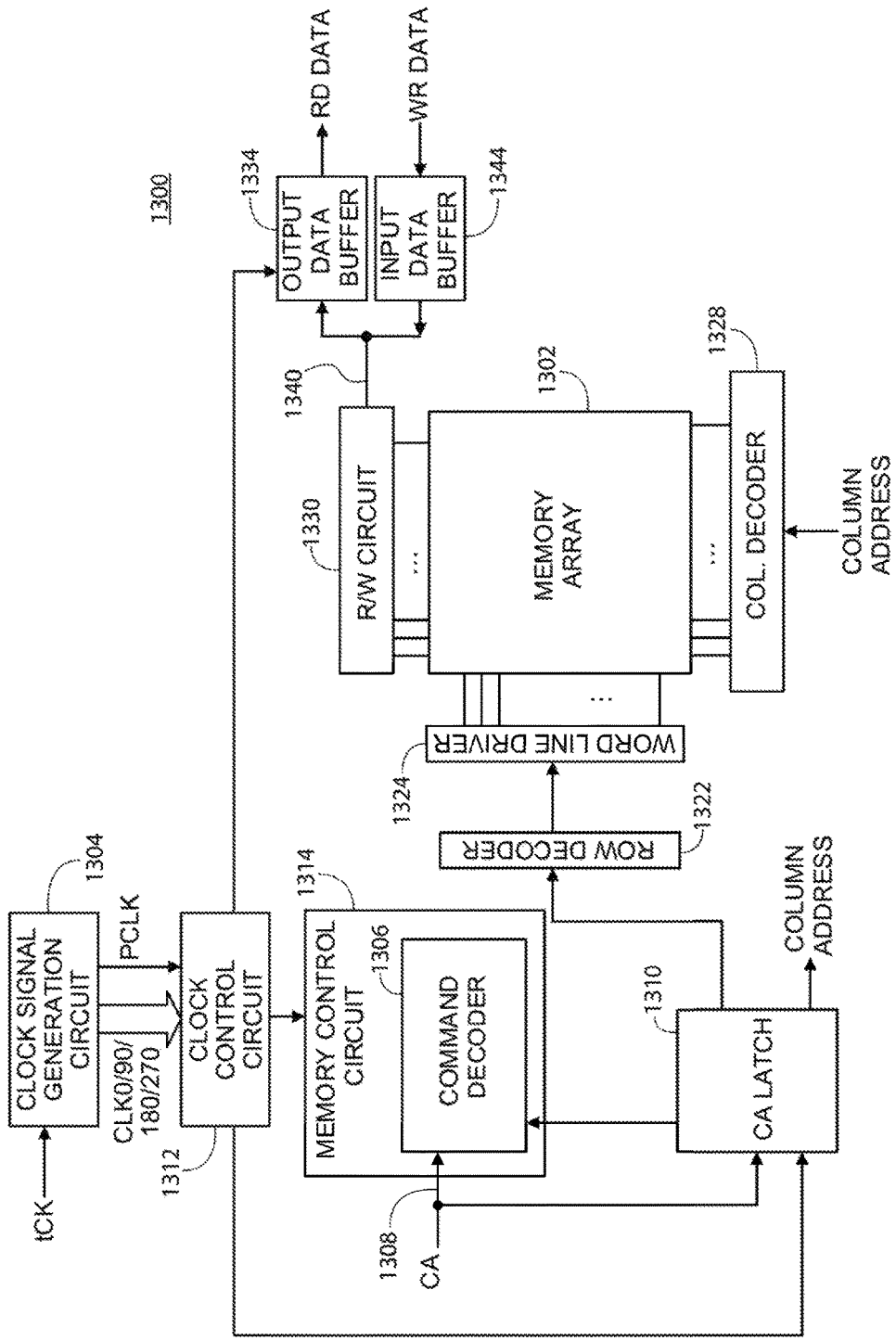
FIG. 13 is a block diagram of a memory, in accordance with an embodiment of the present invention.

FIG. 13 is a block diagram of a memory, according to an embodiment of the invention. The memory 1300 may include an array 1302 of memory cells, which may be, for example, volatile memory cells (e.g., dynamic random-access memory (DRAM) memory cells, static random-access memory (SRAM) memory cells), non-volatile memory cells (e.g., flash memory cells), or some other types, of memory cells. The memory 1300 includes a clock signal generation circuit 1304 that may receive an external clock signal CLK and provide clock signals PCLK and CLK0/90/180/270. The memory 1300 may further include a clock, control circuit 1312 that may provide clock signals to various circuits within the memory 1300. The memory 1300 may include a memory control circuit 1314 which may include a command decoder 1306. The command decoder may receive memory commands through a command/address bus 1308 and provide (e.g., generate) corresponding control signals within the memory 1300 to carry out various memory operations. For example, the command decoder 1306 may respond to memory commands provided to the CA bus 1308 to perform various operations on the memory array 1302. In particular, the command decoder 1306 may be used to provide internal control signals to read data from and write data to the memory array 1302. Row and column address signals may be provided to a CA latch 1310 in the memory 1300 through the CA bus 1308. The CA latch 1310 may then provide a separate column address and a separate row address.

The CA latch 1310 may provide row and column addresses to a row address decoder 1322 and a column address decoder 1328, respectively. The column address decoder 1328 may select bit lines extending through the array 1302 corresponding to respective column addresses. The row address decoder 1322 may be connected to a word line driver 1324 that activates respective rows of memory cells in the array 1302 corresponding to received row addresses. The selected data line (e.g., a bit line or bit lines) corresponding to a received column address, may be coupled to read/write circuitry 1330 to provide read data to an output data buffer 1334 via an input-output data path 1340. Write data may be provided to the memory array 1302 through an input data buffer 1344 and the read/write circuitry 1330.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

What is claimed is:

1. An apparatus comprising:
    a clock control circuit comprising:
        a command/address domain configured to selectively provide a command/address clock signal based, at least in part, on a chip select signal;
        a command domain circuit configured to selectively provide a command clock signal based, at least in part, on the chip select signal;
        a column latency domain circuit configured to selectively provide a column latency clock signal based, at least in part, on a memory command; and
        a four phase domain circuit configured to selectively provide a four phase clock signal based, at least in part, on the memory command.

2. The apparatus of claim 1, further comprising:
    a clock generation circuit configured to receive an external clock signal and to provide a first clock signal and a second clock signal to each of the command/address domain, the command domain circuit, and the column latency domain circuit based, at least in part, on the external clock, wherein the second clock signal is complementary to the first clock signal.

3. The apparatus of claim 2, wherein the clock generation circuit is further configured to provide the four phase clock to the four phase domain circuit based, at least in part, on the external clock.

4. The apparatus of claim 2, wherein the external clock has a first period, and the first clock signal, the second clock signal, and the four phase clock signal each have a second period that is greater than the first period.

5. The apparatus of claim 2, wherein the command/address clock signal comprises a first command/address clock signal and a second command/address clock signal based on the first clock signal and the second clock signal;
    wherein the command clock signal comprises a first command clock signal and a second command clock signal based on the first clock signal and the second clock signal; and
    wherein the column latency clock signal comprises an first column latency clock signal and a second column latency clock signal based on the first clock signal and the second clock signal.

6. The apparatus of claim 1, wherein the command domain circuit is configured to selectively provide the command clock based, at least in part, on an extended chip select signal.

7. The apparatus of claim 1, wherein the command domain circuit is further configured to provide the command clock signal based, at least in part, on one of a write enable signal and a read enable signal.

8. A method comprising:
    receiving, at a command/address domain of a clock control circuit, a first clock signal; an second clock signal, and a chip select signal;
    providing, to a command/address latch, at least one of the first clock signal and the second clock signal responsive to the chip select signal being in an active state;
    providing, by a chip select extension circuit of the clock control circuit, an extended chip select signal based, at least in part, on the chip select signal;
    receiving, at a command domain circuit, the first clock signal, the second clock signal, and the extended chip select signal; and
    providing, to a command decoder, at least one of the first clock signal and the second clock signal based, at least in part, on the extended chip select signal.

9. The method of claim 8, further comprising:
    receiving, at a column latency domain circuit of the clock control circuit, the first clock signal and the second clock signal;
    providing, to a latency shifter circuit, at least one of the first clock signal and the second clock signal based, at least in part, on one of a read enable signal and a write enable signal.

10. The method of claim 9, wherein the read enable signal and the write enable signal are provided in response to memory commands provided by the command decoder.

11. The method of claim 8, further comprising:
    receiving, at a four phase domain circuit of the clock control circuit, a four phase clock signal;
    determining whether there a read burst is in progress; and
    providing, to an output data buffer, the four phase clock responsive to determining that a read burst is in progress.

12. The method of claim 11, wherein the four phase clock signal comprises four clock signals, wherein a first clock signal of the four clock signals has a phase that is offset by 90 degrees from a phase of a second clock signal of the four clock signals.

13. The method of claim 8, wherein the chip select extension circuit extends the chip select signal by a number of cycles of at least one of the first clock signal and the second clock signal.

14. The method of claim 8, wherein the first clock signal and the second clock signal each have a period that is two times a period of an external clock signal.

15. An apparatus comprising:
a clock signal generation circuit configured to receive an external clock signal and to provide a first internal clock signal;
a memory control circuit configured to provide at least one of a read enable signal and a write enable signal
a clock control circuit including a column latency domain circuit configured to receive the first internal clock signal and at least one of the read enable signal and the write enable signal, the column latency domain circuit further configured to provide the first internal clock signal responsive to the at least one of the read enable signal and the write enable signal.

16. The apparatus of claim 15, wherein the column latency domain circuit comprises
a first latch configured to receive the at least one of the read enable signal and the write enable signal and to provide a first output responsive to the first internal clock signal;
a second latch configured to receive the first output and to provide a second output responsive to a second internal clock signal.

17. The apparatus of claim 16, wherein the second internal clock signal is delayed relative to the first internal clock signal.

18. The apparatus of claim 17, wherein the second internal clock signal is delayed by 270 degrees relative to the first internal clock signal.

19. The apparatus of claim 16, further comprising:
a multiplexer configured to provide one of the first output and the second output responsive to a select signal.

20. The apparatus of claim 19, further comprising:
an AND gate configured to selectively provide the first internal clock signal responsive to the multiplexer providing one of the first output and the second output.

* * * * *